(12) United States Patent
Wada (10) Patent No.: US 9,640,462 B2
(45) Date of Patent: May 2, 2017

(54) SEMICONDUCTOR DEVICE HAVING WIRING PAD AND WIRING FORMED ON THE SAME WIRING LAYER

(71) Applicant: Longitude Semiconductor S.A.R.L., Luxembourg (LU)

(72) Inventor: Shoji Wada, Tokyo (JP)

(73) Assignee: Longitude Semiconductor S.A.R.L., Luxembourg (LU)

( * ) Notice: Subject to any disclaimer, the term of this patent is extended or adjusted under 35 U.S.C. 154(b) by 29 days.

(21) Appl. No.: 13/683,085

(22) Filed: Nov. 21, 2012

(65) Prior Publication Data

US 2013/0134584 A1 May 30, 2013

(30) Foreign Application Priority Data

Nov. 24, 2011 (JP) ................................. 2011-256565
Nov. 20, 2012 (JP) ................................. 2012-253815

(51) Int. Cl.
*H01L 23/48* (2006.01)
*H01L 23/00* (2006.01)

(52) U.S. Cl.
CPC ............ *H01L 23/481* (2013.01); *H01L 24/05* (2013.01); *H01L 24/13* (2013.01); *H01L 24/16* (2013.01); *H01L 2224/0401* (2013.01); *H01L 2224/05013* (2013.01); *H01L 2224/05094* (2013.01); *H01L 2224/05096* (2013.01); *H01L 2224/13014* (2013.01); *H01L 2224/13025* (2013.01); *H01L 2224/14181* (2013.01); *H01L 2224/16146* (2013.01); *H01L 2224/16225* (2013.01); *H01L 2224/16227* (2013.01); *H01L 2924/15311* (2013.01)

(58) Field of Classification Search
USPC .......................................... 257/737, 774–778
See application file for complete search history.

(56) References Cited

U.S. PATENT DOCUMENTS

| 8,299,624 B2 | 10/2012 | Matsuo |
| 8,304,862 B2 | 11/2012 | Taguchi et al. |
| 2010/0155928 A1 | 6/2010 | Taguchi et al. |
| 2011/0084385 A1* | 4/2011 | Itaya et al. ..................... 257/737 |
| 2011/0089571 A1 | 4/2011 | Matsuo |
| 2013/0114364 A1* | 5/2013 | Sakakibara et al. .......... 365/222 |

FOREIGN PATENT DOCUMENTS

| JP | 2010-153492 | 7/2010 |
| JP | 2011-086773 | 4/2011 |

* cited by examiner

Primary Examiner — Marvin Payen (57) ABSTRACT

Disclosed herein is a device that includes a first wiring provided as a first-level wiring layer and elongated in a first direction; and a first wiring pad provided as the first-level wiring layer, the first wiring pad being rectangular and including a first side edge that is elongated in the first direction and a second side edge that is elongated in a second direction crossing to the first direction, the first side edge being greater in length than the second side edge, the first wiring pad being greater in length in the second direction than the first wiring.

23 Claims, 12 Drawing Sheets

SEMICONDUCTOR DEVICE HAVING WIRING PAD AND WIRING FORMED ON THE SAME WIRING LAYER

BACKGROUND OF THE INVENTION

Field of the Invention

The present invention relates to a semiconductor device and particularly relates to the structure of penetration electrodes provided in a semiconductor device.

Description of Related Art

Storage capacity required for semiconductor devices such as DRAM (Dynamic Random Access Memory) has been increasing year after year. In recent years, a method has been proposed to satisfy such requirements in which a plurality of semiconductor chips is stacked and connected electrically via penetration electrodes (i.e. TSV: Through Silicon Via) arranged in a silicon substrate (see Japanese Patent Application Laid-open No. 2011-86773 and No. 2010-153492).

The penetration electrodes are electrically connected to wiring pads provided in a multi-level wiring structure formed on the main surface of the semiconductor substrate. Each of the penetration electrodes is electrically connected to a corresponding circuit block(s) via a wiring pad. There are two kinds of the penetration electrodes. One is a signal penetration electrode for transmitting signal such as a command signal and an address signal. And the other is a power penetration electrode for supplying a power voltage. A wiring pad provided for a power penetration electrode requires a larger area than a wiring pad provided for a signal penetration electrode in order to supply a power voltage stably to a plurality of stacked semiconductor chips.

A plurality of penetration electrodes including signal penetration electrodes and power penetration electrodes are aligned two-dimensionally on a semiconductor chip. In the multi-level wiring structure where the penetration electrodes are arranged, a wiring pad is provided for each of the plurality of penetration electrodes and various kinds of wirings such as a signal line and a power line are arranged in a space between the plural wiring pads. Here, as stated above, a wiring pad of the power penetration electrode has a larger area than a wiring pad of the signal penetration electrode. Accordingly, in the multi-level wiring structure where these plural penetration electrodes are arranged, the number of wirings to be arranged between the pad electrodes is limited because of its larger area.

SUMMARY

In one embodiment, there is provided a semiconductor device that includes: a semiconductor substrate; a plurality of penetration electrodes penetrating through the semiconductor substrate; a plurality of wiring pads each vertically aligned with and electrically connected to an associated one of the penetration electrodes; and a wiring elongated in a first direction between the wiring pads and electrically connected to one of the wiring pads. At least one of the wiring pads has a shape with a width in the first direction being larger than a width in a second direction crossing to the first direction.

In another embodiment, there is provided a device that includes: a first wiring provided as a first-level wiring layer and elongated in a first direction; and a first wiring pad provided as the first-level wiring layer, the first wiring pad being rectangular and including a first side edge that is elongated in the first direction and a second side edge that is elongated in a second direction crossing to the first direction, the first side edge being greater in length than the second side edge, the first wiring pad being greater in length in the second direction than the first wiring.

In still another embodiment, there is provided a device that includes: a first wiring provided as a first-level wiring layer and elongated in a first direction; a first wiring pad provided as the first-level wiring layer and including a first side edge that is elongated in the first direction and a second side edge that is elongated in a second direction crossing to the first direction; and a second wiring pad provided as the first-level wiring layer and including a third side edge that is elongated in the first direction and a fourth side edge that is elongated in the second direction, the third side edge of the second wiring pad is smaller in length than the first side edge of the first wiring pad, the fourth side edge of the second wiring pad is substantially equal in length to the second side edge of the first wiring pad. The first and second wiring pad being arranged in line along the first wiring.

According to the present invention, it is made easier to ensure an area for wirings in a semiconductor device structured to arrange wirings between a plurality of penetration electrodes.

DETAILED DESCRIPTION OF THE EMBODIMENTS

Preferred embodiments of the present invention will be explained below in detail with reference to the accompanying drawings.

Figure 1:
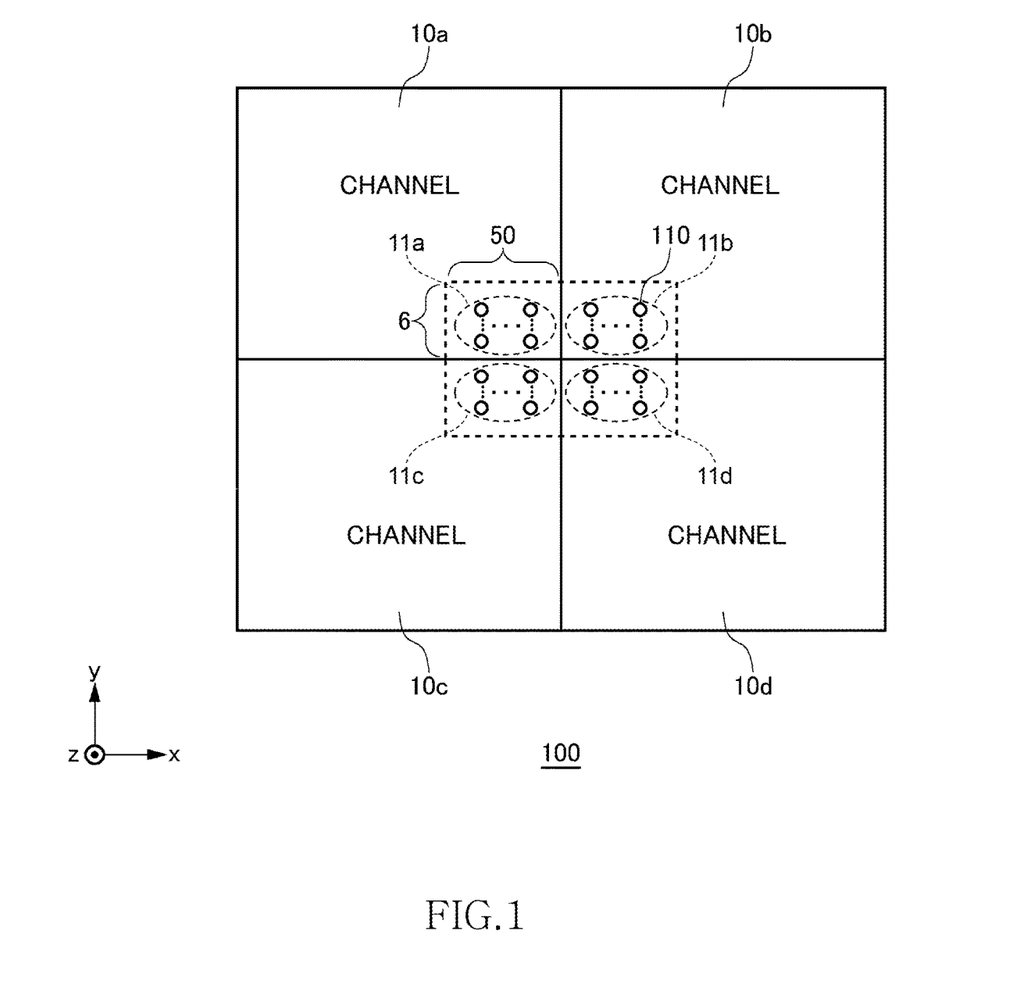
FIG. 1 is a schematic diagram of a semiconductor device in an embodiment of the present invention.

The semiconductor device 100, according to the first embodiment of the present invention, shown in FIG. 1 is a so-called wide IO-DRAM in which four units of DRAM (Dynamic Random Access Memory) 10 having a volatile storage are arranged on one chip (which is a semiconductor chip and simply referred to as a chip). Here, the four units of the DRAM 10 are referred to as channels 1, 2, 3 and 4. Each of the channels 1 to 4 has a terminal group including a plurality of signal terminals for transmitting and receiving data Data, a command signal CMD, an address signal ADD and a clock signal CK and a plurality of power terminals to which a plurality of power voltages is supplied. Note that in place of providing the plurality of the power terminals for each of the channels 1 to 4, the plurality of the power terminals may be shared by the channels 1 to 4. In this case, the plurality of the shared power terminals is arranged to be dispersed in the terminal group in each of the channels 1 to 4. Owing to such a structure, each of the channels 1 to 4 is allowed to transmit/receive data, a command and an address independently from each other to/from the outside of the chip. That is, each of the channels 1 to 4 can be independently controlled to perform various kinds of operations such as, for example, a read operation, a write operation and a refresh operation by a corresponding control circuit to be described later.

As shown in FIG. 1, the terminal group 11a to 11d included in each of the four channels 1 to 4 is arranged at the center of the chip. A plurality of terminals 110 in each of the terminal group 11a to 11d in the present embodiment is aligned in a lattice pattern on 6 rows by 50 columns in each of the channels. Accordingly, the four channels are supposed to contain a total of 1200 terminals 110 on 12 rows by 100 columns as a whole. Note that, as will be described later, each terminal is connected to a corresponding penetration electrode or more specifically a signal penetration electrode or a power penetration electrode. That is, below the terminal group at the center of the chip shown in FIG. 1, a plurality of signal penetration electrodes and a plurality of power penetration electrodes are provided in two-dimensional arrangement in x direction and y direction.

Figure 2:
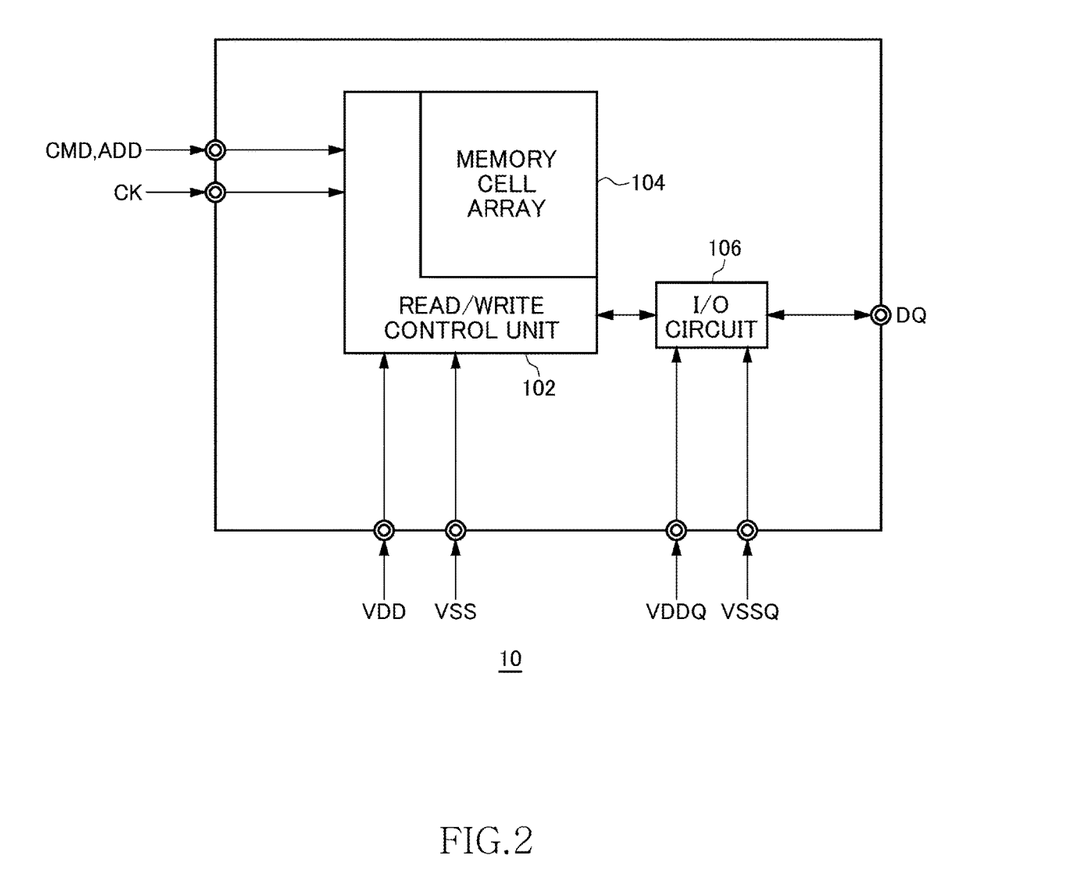
FIG. 2 is a block diagram showing a configuration of the channel as an example of the DRAM.

A configuration of the channel 1 will be explained with reference to FIG. 2. Note that, in the present embodiment, the other channels 2 to 4 also have substantially the same configuration as the channel 1 shown in FIG. 2.

The command signal CMD, the address signal ADD and the clock signal CK are supplied from external terminals of the semiconductor device 100 to a read/write control unit 102. External voltages VDD and VSS are also supplied to the read/write control unit 102. The read/write control unit 102 includes a voltage generating circuit that generates various kinds of internal voltages based on the external voltage VDD and VSS and an access control circuit that accesses a memory cell array 104 according to the command signal CMD, the address signal ADD and the clock signal CK.

The memory cell array 104 includes a plurality of word lines, bit lines and memory cells that are located at intersection points of word lines and bit lines. The memory cells hold data. The read/write control unit 102 selectively activates one or ones of the word lines and selects one or ones of the bit lines according to the command signal CMD, the address signal ADD and the clock signal CK in order to execute data writing/reading operation in a desired memory cell.

The memory cell array 104 transmits/receives data DQ to/from external devices via the read/write control unit 102 and an input/output circuit 106. External voltages VDDQ and VSSQ are supplied to the input/output circuit 106 as a power supply. Write data sent from the input/output circuit 106 via the read/write control unit 102 is written in a desired memory cell of the memory cell array 104. Read data is outputted from the memory cell array 104 to the outside via the read/write control unit 102 and the input/output circuit 106. Here, FIG. 2 shows an example of one transfer route of the data DQ or shows only one input/output circuit 106 and one data terminal DQ for simple explanation, but a plurality of transfer routes may also be provided. As an example, 128 data transfer routers may be provided in the channel 1. In this configuration, the channel 1 is allowed to transmit/receive 128 pieces of the data DQ to/from the outside simultaneously.

In the following explanation, the command signal CMD, the address signal ADD, the clock signal CK and the data DQ are collectively referred to as "signal" and the external voltages VDD, VSS, VDDQ and VSSQ are referred to as "power".

Figure 3:
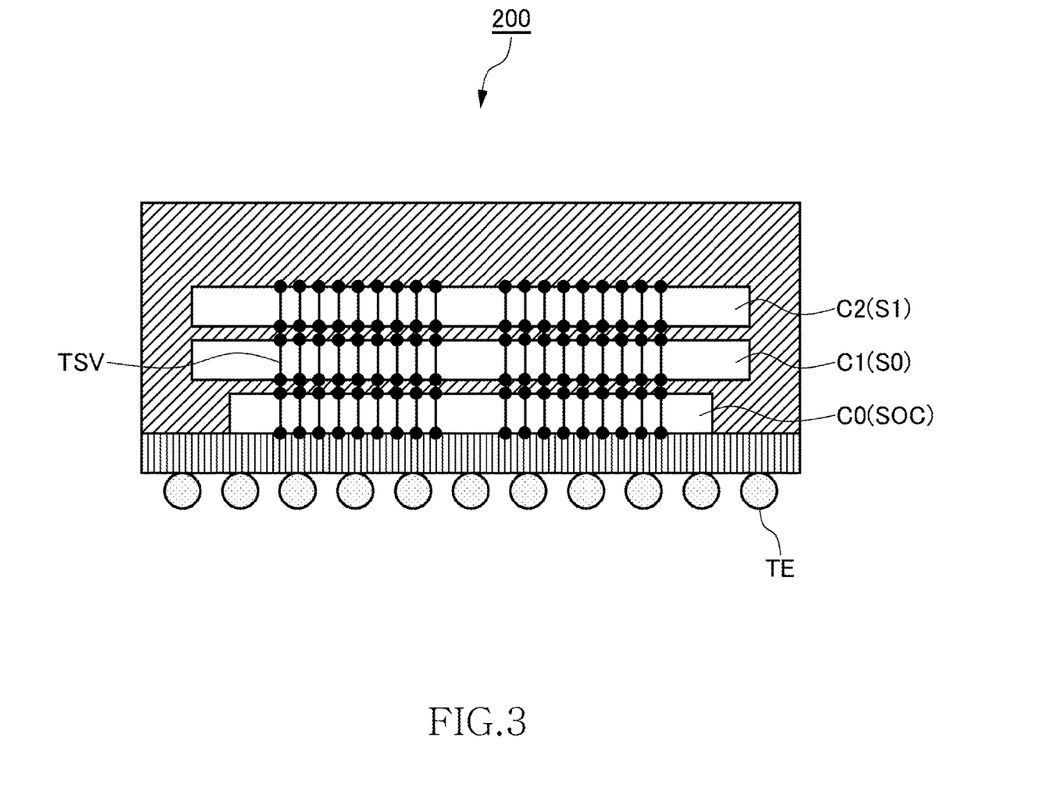
FIG. 3 is a cross-sectional view of a semiconductor device 200 of an embodiment of the present invention.

Turning to FIG. 3, the semiconductor device 200 has a structure in which three chips are stacked. That is, chips C0, C1 and C2 are stacked in the order from a lower layer. The chip C0 is, for example, SOC (System on Chip which is a controller chip) for controlling the semiconductor device 200, whereas the chip C1 (or slice S0) and the chip C2 (or slice S1) are memory chips including the semiconductor device 100 shown in FIG. 1. The semiconductor device 200 is a system in which the chips C0, C1 and C2 are packaged integrally. If the chip C1 and the chip C2 are included in the structure without the chip C0, it is a semiconductor device serving as an integrally packaged passive element. The chip C1 and the chip C2 communicate with the chip C0 under the control of the chip C0. The chip C0 communicates with the outside via external terminals TE. The chip C1 and the chip C2 may communicate with each other under the control of the chip C0 for each channel. For example, it is useful to copy data between channels and process data between channels relating to data processing within the SOC of the chip C0. The chip C1 and the chip C2 may also be connected to the outside via the chip C0 and the external terminals TE under the control of the chip C0. Each of the chips C1 and C2 serving as a memory chip is divided into plural areas corresponding to the four channels 1 to 4 as shown in FIG. 1. Here, the number of the chips C1 and C2 to be stacked may be one (i.e. only the chip C1) or may also be two or more.

As shown in FIG. 3, corresponding terminals in the chips C0, C1 and C2 are electrically connected with each other via penetration electrodes TSV which penetrate through an inner space of the semiconductor device 200 in a stacking direction. More specifically, these plural penetration electrodes include a plurality of signal penetration electrodes for connecting a plurality of signal terminals to each other and a plurality of power penetration electrodes for connecting a plurality of power terminals to each other. In addition, a plurality of the external terminals TE formed on a bottom surface of the semiconductor device 200 is electrically connected to corresponding terminal groups in the chips C0, C1 and C2.

Next, structures of the signal penetration electrodes and the power penetration electrodes provided in the semiconductor device 10 shown in FIG. 1 will be explained one by one.

Figure 4:
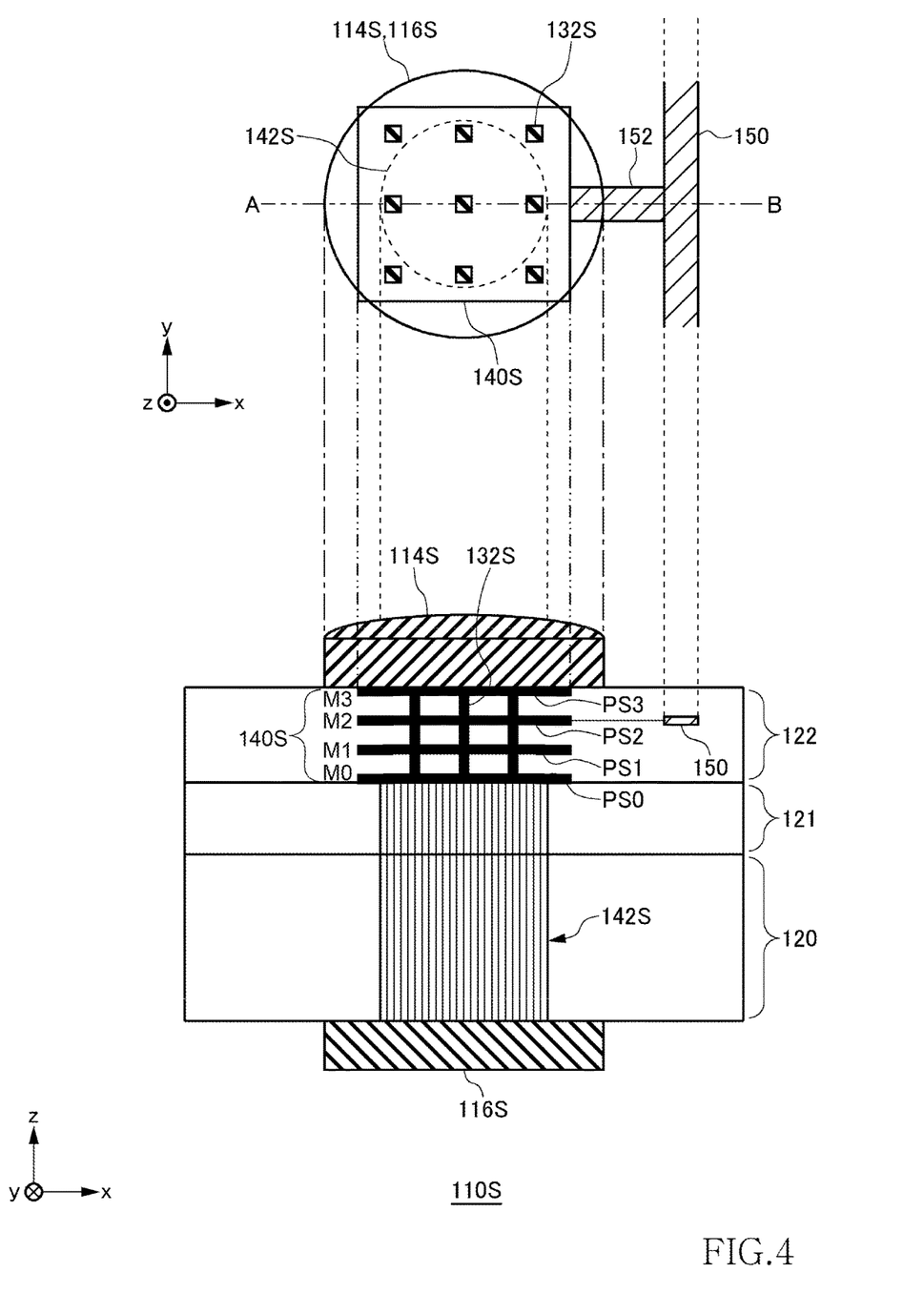
FIG. 4 is a structural view of a signal penetration electrode.

In FIG. 4, the upper diagram is a plan view of the signal penetration electrode 110S and the lower diagram is a cross sectional view in a line segment A-B in the upper diagram. The semiconductor device 100 includes a semiconductor substrate 120, a first insulating layer 121 formed above the semiconductor substrate 120 and a second insulating layer 122 formed above the first insulating layer 121.

The semiconductor substrate 120 is made of silicon or the like. The first insulating layer 121 includes a silicon oxide film and a silicon nitride film or other films. In the semiconductor substrate 120 and the first insulating layer 121, a transistor or other elements are formed, further various kinds of circuit elements not shown are formed to execute substantial circuit operations in the semiconductor device 100.

The second insulating layer 122 includes a silicon oxide film and a silicon nitride film or other films. In the second insulating layer 122, a multi-level wiring structure including a plurality of metal wiring layers M0 to M3 is formed. Wiring pads PS0 to PS3 in a wiring pad part 140S to be described later in the signal penetration electrode are formed as the metal wiring layers M0 to M3 of the multi-level wiring structure, respectively. As shown in FIG. 4, a planner shape of each of the wiring pads PS0 to PS3 is substantially square.

The signal penetration electrode 110S serves as a signal transmission path penetrating through the semiconductor substrate 120, the first insulating layer 121 and the second insulating layer 122 in z axis direction. A front side bump 114S and a back side bump 116S are provided in both ends of the signal penetration electrode 110S and these bumps serve as signal terminals in the semiconductor device 100.

A penetrating part of the signal penetration electrode 110S is roughly divided into a body part 142S and the wiring pad part 140S. The body part 142S penetrates through the semiconductor substrate 120 and the first insulating layer 121 to reach the wiring pad PS0 in the wiring pad part 140S. The wiring pad part 140S is formed as a multi-level wiring structure in the second insulating layer 122. In the multi-level wiring structure, various kinds of wirings such as a signal line 150 are formed in addition to the wiring pad part 140S. In the present embodiment, the wiring pad part 140S includes four layers that are the wiring pads PS0 (in M0) to PS3 (in M3). FIG. 4 also shows the signal line 150 which is arranged in the same wiring layer M2 as the wiring pad PS2 (in M2) and elongated in y axis direction.

In the wiring pad part 140S, the wiring pads PS0 to PS3 are provided respectively as the wiring layers M0 to M3. The wiring pads PS0 to PS3 are connected to each other by a plurality of through-hole electrodes 132S. FIG. 4 shows the wiring pads PS0 to PS3 are connected to each other by 9 pieces of the through-hole electrode 132. Therefore, for example, a signal inputted from the back side bump 116S is supplied to the wiring pad PS0 via the body part 142S and transmitted to the front side bump 114S by passing through the through-hole electrodes 132S and the wiring pads PS1 to PS3. On the contrary, a signal inputted from the front side bump 114S is supplied to the wiring pad PS3 and supplied to the body part 142S via the through-hole electrodes 132S and the wiring pads PS2 to PS0 so as to be transmitted to the back side bump 116S. Further, FIG. 4 shows the signal line 150 in the wiring layer M2 is connected to the wiring pad PS2 in the wiring layer M2 via a transmission line 152. Therefore, a signal passing through the signal penetration electrode 110S is also supplied to the signal line 150.

Before giving an explanation for the structure of a power penetration electrode 110P in the present embodiment, the prototype example that the inventor has conceived in the course of making the present invention will be explained with reference to FIG. 5.

Figure 5:
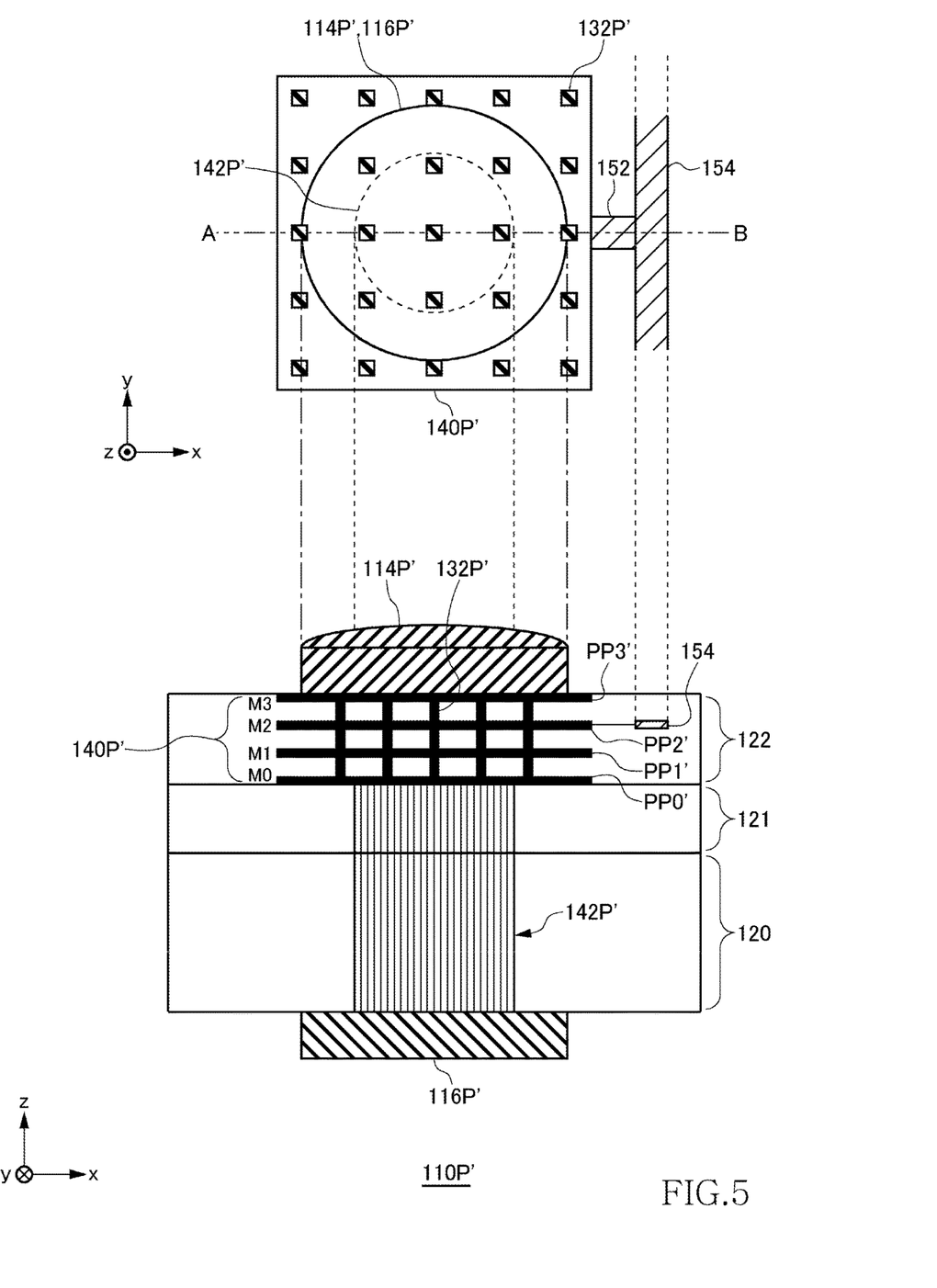
FIG. 5 is a structural view of a power penetration electrode that the inventor has conceived as a prototype in the course of making the present invention.

In FIG. 5, the upper diagram is a plan view of the power penetration electrode 110P' and the lower diagram is a cross sectional view in a line segment A-B in the upper. A front side bump 114P' and a back side bump 116P' are also provided in both ends of the power penetration electrode 110P' and these bumps serve as power terminals in the semiconductor device 100. Note that same reference numbers in FIG. 5 refer to corresponding elements in FIG. 4 and explanation thereof will be omitted.

As shown in FIG. 5, a power line 154 is formed on the wiring layer M2. A wiring pad part 140P' in the power penetration electrode 110P' also include wiring pads PP0' to PP3' provided respectively as the wring layers M0 to M3. The wiring pads PP0' to PP3' are connected to each other by a plurality of through-hole electrodes 132P'. FIG. 5 shows the wiring pads PP0' to PP3' are connected to each other by 25 pieces of the through-hole electrode 132P'. Therefore, for example, a power voltage supplied form the back side bump 116P' is transferred to the wiring pad PP0' via a body part 142P' and transferred to the front side bump 114P' by passing through the through-hole electrodes 132P' and the wiring pads PP1' to PP3'. On the contrary, a power voltage supplied from the front side bump 114P' is transferred to the wiring pad PP3' and transferred to the body part 142P' via the through-hole electrodes 132P' and the wiring pads PP2' to PP0' so as to be transferred to the back side bump 116P'. FIG. 5 shows the power line 154 in the wiring layer M2 is connected to the wiring pad PP2' in the wiring layer M2 via the transmission line 152. Therefore, a power voltage in the power penetration electrode 110P' is also supplied to the power line 154.

In comparison with the signal penetration electrode 110S, the power penetration electrode 110P' is greater in the number of the through-hole electrodes 132P'. This is for the purpose of suppressing a voltage drop which occurs in transmission of a power voltage. Since the wiring pads PP0' to PP3' need to be connected to each other by more of the through-hole electrodes than the wiring pads PS0 to PS3, the wiring pads PP0' to PP3' in the power penetration electrode 110P' require a larger area than the wiring pads PS0 to PS3 in the signal penetration electrode 110S.

Next, explanation will be made for a problem arising with lattice-pattern arrangement in the power penetration electrode 110P' presented in the prototype example and the signal penetration electrode 110S.

Figure 6:
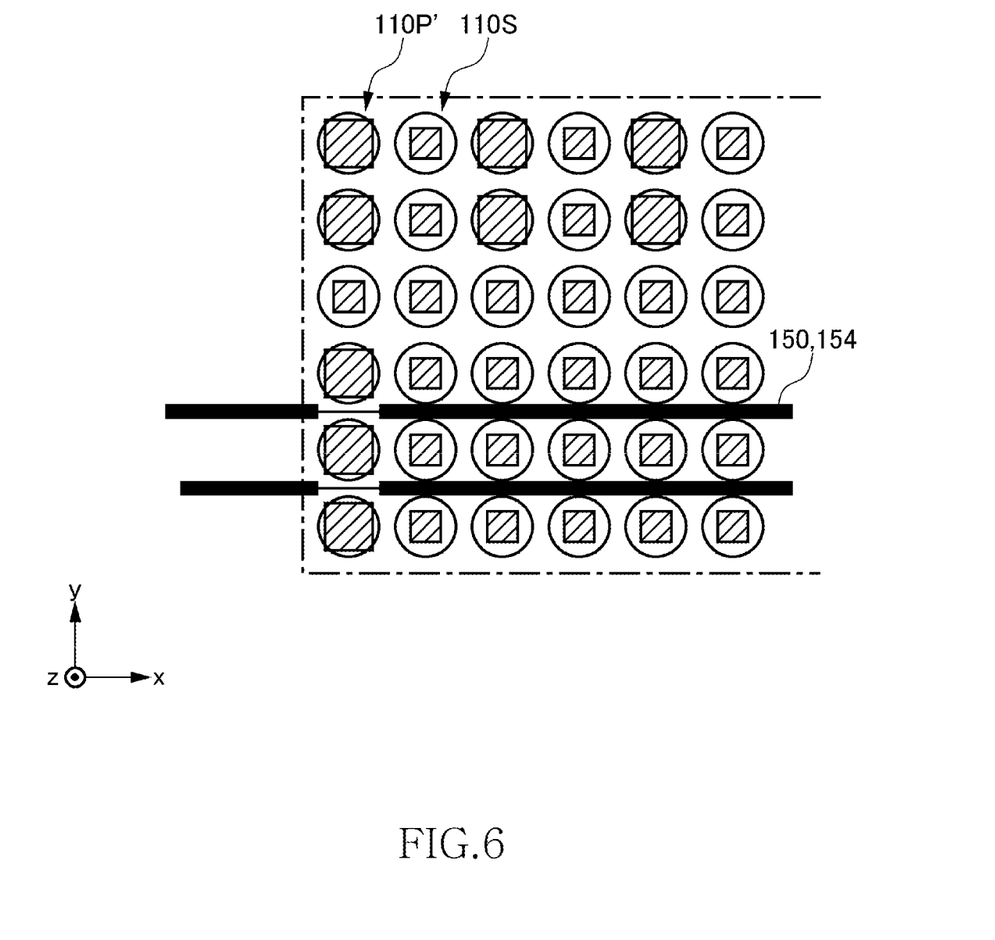
FIG. 6 is a schematic diagram of wiring in the prototype example.

FIG. 6 shows the penetration electrodes 110 (including the signal penetration electrodes 110S and the power penetration electrodes 110P') are arranged in a lattice pattern. FIG. 6 corresponds to any one of the wiring layers M0 to M3. As stated above, the penetration electrodes 110 include the signal penetration electrodes 110S and the power penetration electrodes 110P, wherein the wiring pads PP0' to PP3' in the power penetration electrode 110P' require a larger area than those in the signal penetration electrode 110S. The signal line 150 and the power line 154 are arranged between the penetration electrodes 110. As stated above, the wiring pads PP0' to PP3' in the power penetration electrode 110P' are larger in area than the wiring pads PS0 to PS3 in the signal penetration electrode 110S, which means the space between two electrodes is substantially defined by the wiring pads PP0' to PP3' in the power penetration electrode 110P'. In other words, the wiring pads PP0' to PP3' in the power penetration electrode 110P' limit a wiring area.

In order to ensure a sufficient electrode interval, the penetration electrodes 110 should be spaced at an enough distance from each other. However, it is necessary for increasing in spaces between the penetration electrodes 110 to expand an area where the penetration electrodes 110 are arranged, whereby resulting in an increase of a chip area of the semiconductor device 100.

Figure 7:
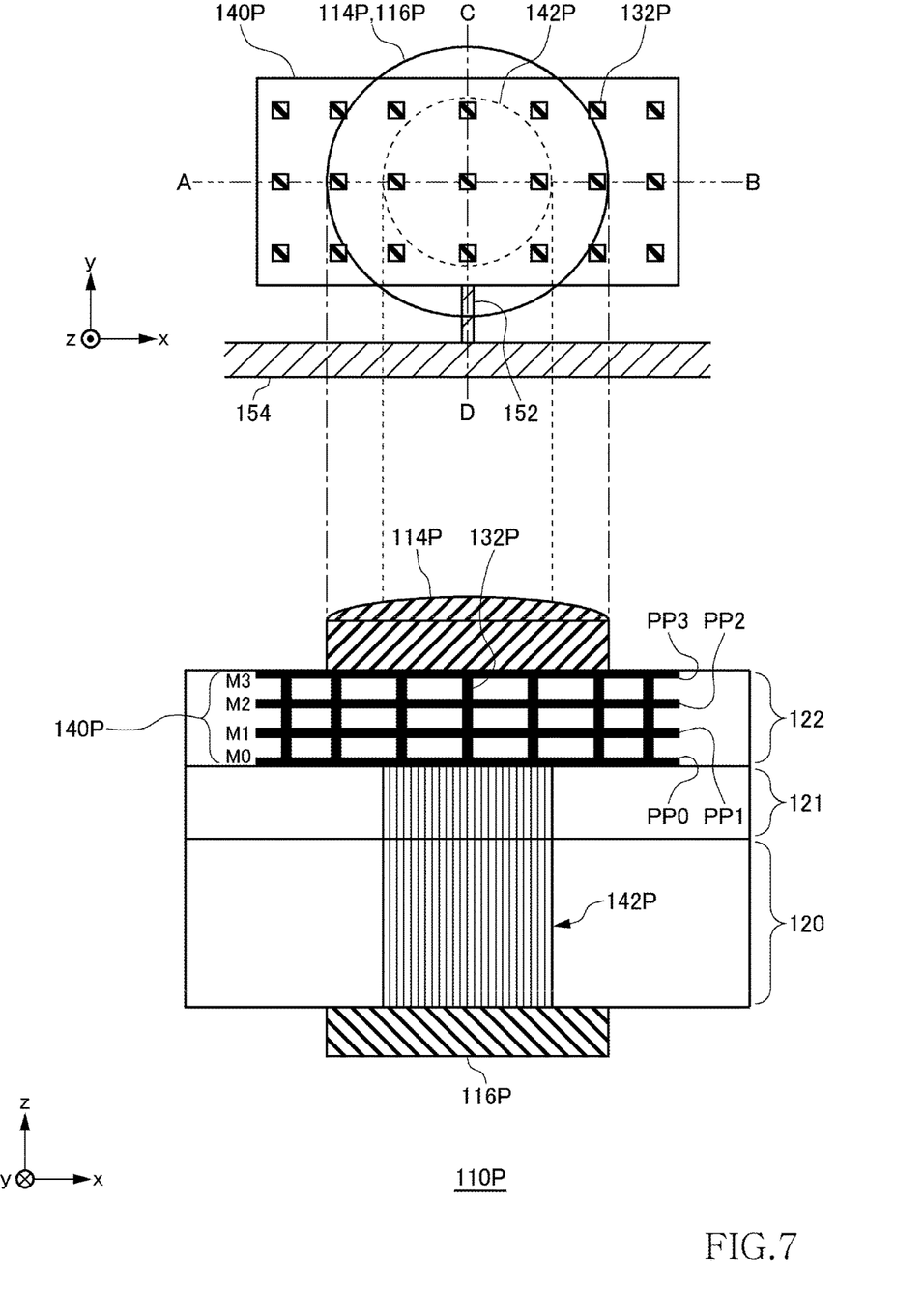
FIG. 7 is a structural view of the power penetration electrode according to the first example.
Figure 8:
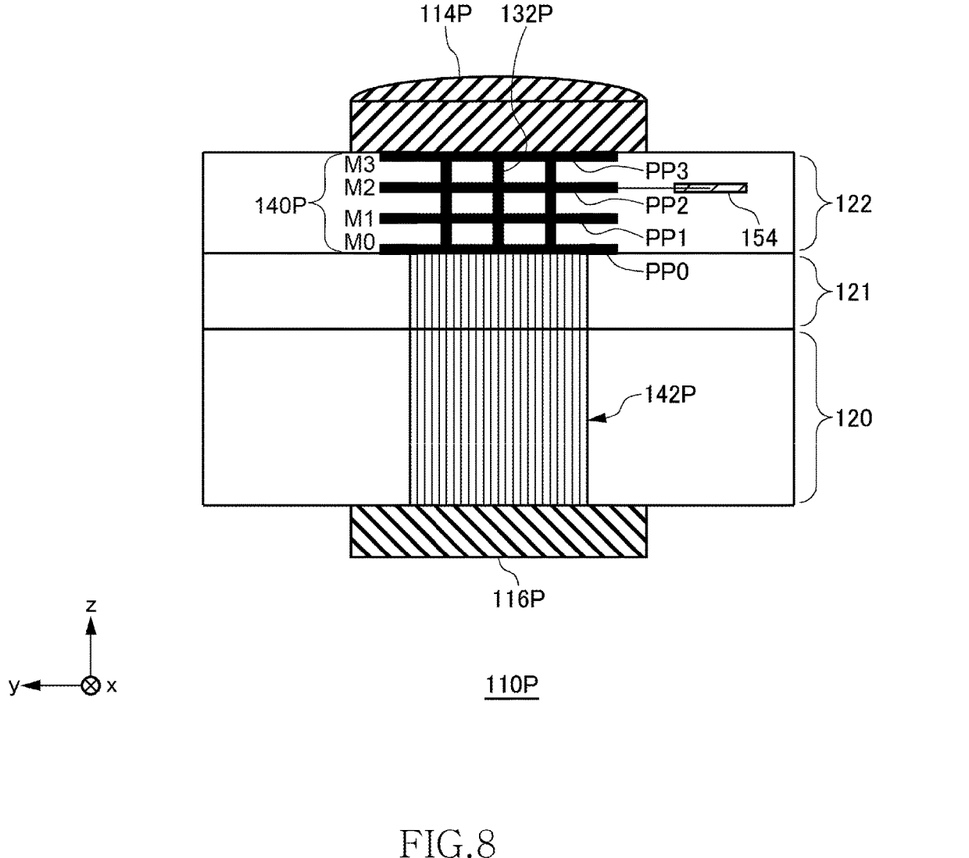
FIG. 8 is a structural view of the power penetration electrode according to the second example.

The configuration of the power penetration electrode 110P according to the present embodiment will be explained with reference to FIGS. 7 and 8. In FIG. 7, the upper diagram is a plane view of the power penetration electrode 110P and the lower diagram is a cross sectional view in a line segment A-B in the upper, while FIG. 8 is a cross sectional view in a line segment C-D in the upper diagram of FIG. 7. A front side bump 114P and a back side bump 116P are also provided in both ends of the power penetration electrode 110P and these bumps serve as power terminals in the semiconductor device 100. Note that same numbers in FIG. 7 and FIG. 8 refer to corresponding elements in FIG. 4 and FIG. 5 and explanation thereof will be omitted.

The power penetration electrode 110P serves as a power voltage transmission path which penetrates through the semiconductor substrate 120, the first insulating layer 121 and the second insulating layer 122 in z axis direction. The front side bump 114P and the back side bump 116P are provided in both ends of the power penetration electrode 110P and these bumps serve as power terminals in the semiconductor device 100.

A penetrating part in the power penetration electrode 110P is roughly divided into a body part 142P and a wiring pad part 140P. The body part 142P penetrates through the semiconductor substrate 120 and the first insulating layer 121 to reach a wiring pad PP0 in the wiring pad part 140P. The wiring pad part 140P is formed in the multi-level wiring structure in the second insulating layer 122. In the multi-level wiring structure, the various kinds of wirings such as the signal line 150 and the power line 154 are formed in addition to the wiring pad part 140P. In the present embodiment, the wiring pad part 140P includes four layers that are wiring pads PP0 (in M0) to PP3 (in M3). FIG. 7 and FIG. 8 also show the power line 154 is arranged in the same wiring layer M2 as the wiring pad PP2 (or M2) and elongated in x axis direction.

In the wiring pad part 140, the wiring pads PP0 to PP3 are provided respectively as the wiring layers M0 to M3. The wiring pads PP0 to PP3 are connected to each other by a plurality of through-hole electrodes 132P.

Here, the difference between the power penetration electrode 110P' shown in the prototype example shown in FIG. 5 and the power penetration electrode 110P in the present embodiment is the shape of the wiring pads PP0 to PP3. The wiring pads PP0 to PP3 in the present embodiment are formed into a rectangular shape elongated in x axis direction. The number of the through hole electrodes 132P is 21 which is calculated by multiplying 3 rows by 7 columns. Of course, the number will be 24 in the case of 8 columns and 27 in the case of 9 columns, which means the number of the through-holes 132P to connect the wiring pads PP0 to PP3 to each other can be ensured sufficiently by adjusting the length of the wiring pads PP0 to PP3. The width of the wiring pads PP0 to PP3 in the power penetration electrode 110P in y direction is substantially equivalent to the width of the wiring pads PS0 to PS3 in the signal penetration electrode 110S.

A power voltage supplied to the back side bump 116P is supplied to the wiring pad PP0 via the body part 142P, and supplied to the front side bump 114P by passing through the through-hole electrodes 132P and the wiring pads PP1 to PP3. On the contrary, a power voltage supplied from the front side bump 114P is supplied to the wiring pad PP3 and supplied to the body part 142P via the through-hole electrodes 132P and the wiring pads PP2 to PP0 so as to be supplied to the back side bump 116P. FIG. 7 further shows the power line 154 in the wiring layer M2 is connected to the wiring pad PP2 in the wiring layer M2 via the transmission line 152. Therefore, a power voltage passing through the power penetration electrode 110P is also supplied to the power line 154.

Figure 9:
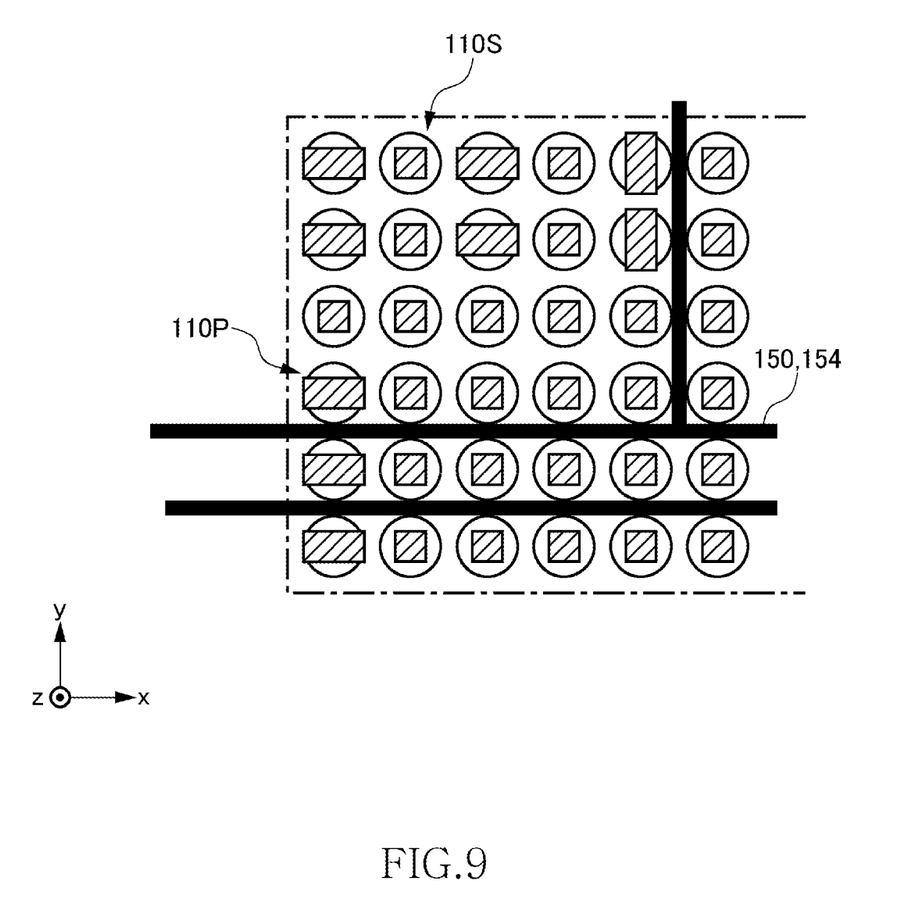
FIG. 9 is a schematic view of wiring according to an embodiment of the present invention.

As shown in FIG. 9, in the present embodiment, the wiring pads PP0 to PP3 adjacent to the signal line 150 or the power line 154 in the power penetration electrode 110P are formed into a rectangular shape by using an elongated direction of wiring as a longitudinal direction. For example, in the case of the power penetration electrode 110P in which the wiring pads PP0 to PP3 are adjacent to wirings (i.e. the signal line 150 and the power line 154) elongated in x direction, the wiring pads PP0 to PP3 are formed into a shape which is longer in x direction than in y direction. The length of the wiring pads PP0 to PP3 in the power penetration electrode 110P along y direction and the length of the signal penetration electrode 110S are substantially the same. As a result, a wiring area is not limited by the wiring pads PP0 to PP3 of a large size in the power penetration electrode 110P, whereby realizing a structure in which a sufficient wiring area is ensured easily without a great expansion of the area where the penetration electrodes are formed. In the case of the power penetration electrode 110P with the wiring pads PP0 to PP3 adjacent to wirings elongated in y direction, due to the similar reason, the wiring pads PP0 to PP3 are formed into a shape which is longer in y direction than in x direction. Owing to the above structure, a sufficient wiring area is ensured without a great expansion of the area where the penetration electrodes are formed, in addition to allow arrangement of a sufficient number of the through hole electrodes 132P for the power penetration electrodes 110P.

Figure 10:
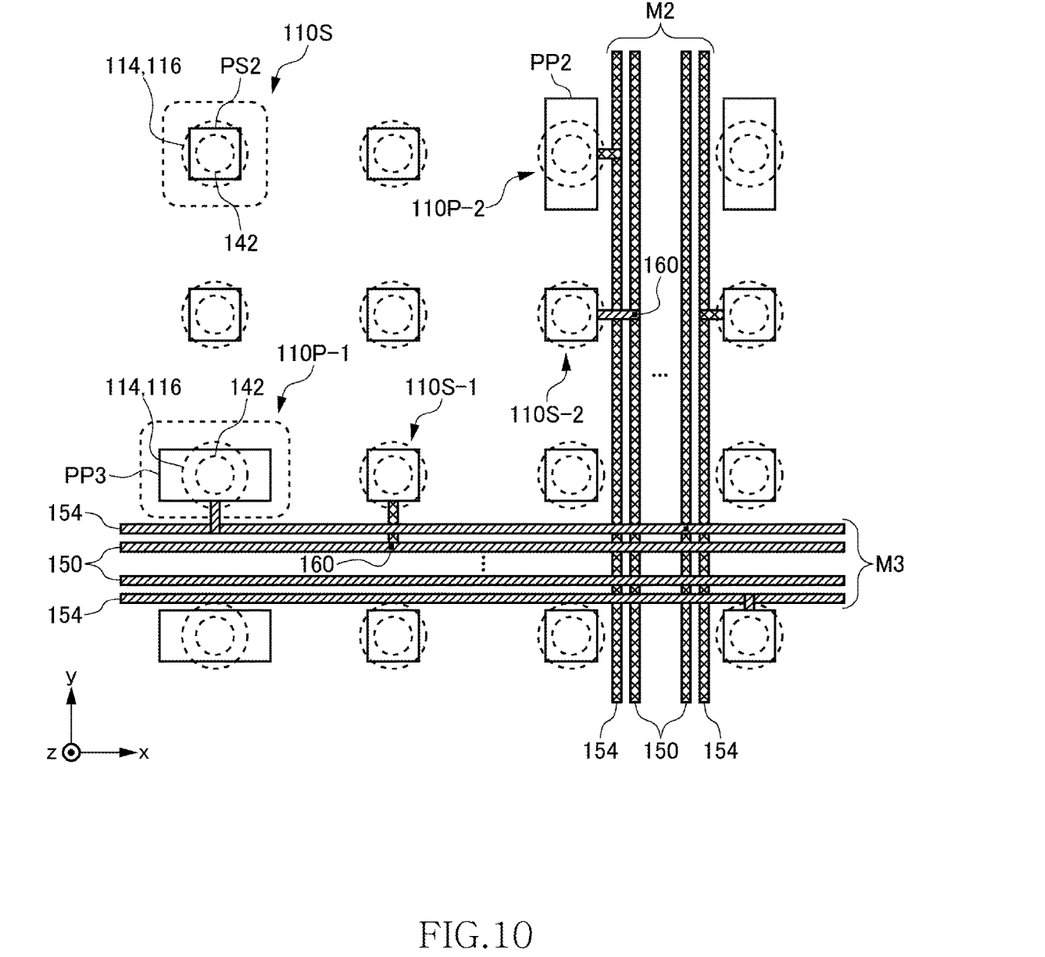
FIG. 10 is a detailed structural view of wiring according to an embodiment of the present invention.

A detailed structural will be explained with reference to FIG. 10. FIG. 10 shows the wiring layers M2 and M3. Each of the wiring layer M2 and the wiring layer M3 is provided with four wirings. Here, a plurality of wirings arranged in the wiring layer M3 is elongated in x direction and wirings arranged in the wiring layer M2 are elongated in y direction. In each of the wiring layers M2 and M3, two inner wirings are the signal lines 150 and two outer wirings are the power line 154. A power penetration electrode 110P-1 is provided with the wiring pad PP3 which is formed as the wiring layer M3 and connected to the power line 154 (in M3 layer) via the transmission line 152. A signal penetration electrode 110S-1 is provided with the wiring pad PS2 which is formed as the wiring layer M2 and connected to the signal line 150 (in M3 layer) via the transmission line 152 and a through-hole 160. A power penetration electrode 110P-2 is provided with the wiring pad PP2 which is formed as the wiring layer M2 and connected to the power line 154 (in M2 layer). A signal penetration electrode 110S-2 is provided with the wiring pad PP3 which is created as the wiring layer M3 and connected to the signal line 150 (in M2 layer) via the through-hole 160.

Due to the aforementioned reason, the wiring pad PP3 in the power penetration electrode 110P-1 is formed into a rectangular shape by using an elongated direction (i.e. x direction) of the power line 154 (in M3 layer) adjacent to the wiring pad PP3 as a longitudinal direction, and the wiring pad PP2 in the power penetration electrode 110P-2 is formed into a rectangular shape by using an elongated direction (i.e. y direction) of the power line 154 (in M2 layer) adjacent to the wiring pad PP2 as a longitudinal direction. As a result, even if the signal penetration electrode 110S and the power penetration electrode 110P are arranged at the same electrode interval, a sufficient wiring area will be easily ensured in the structure.

A modified example of the power penetration electrode 110P will be explained with reference to FIG. 11. Note that same reference numbers in FIG. 11 refer to corresponding elements in FIGS. 7 and 8 and explanation will be omitted. In the example shown in FIG. 11, the metal wiring layers M0 to M3 are not arranged at even distance. More specifically, a distance between the metal wiring layer M0 and the metal wiring layer M1 is larger than a distance between the metal wiring layer M1 and the metal wiring layer M2 and a distance between the metal wiring layer M2 and the metal wiring layer M3. In a power penetration electrode 1101P shown in FIG. 11 based on the aforementioned structure of the metal wiring layers, a resistance value per one piece of through-hole electrode 1321P which connects a wiring pad PP01 formed as the metal wiring layer M0 and a wiring pad PP11 formed as the metal wiring layer M1 is larger than a resistance value per one piece of through-hole electrode 1331P which connects the wiring pad PP11 and a wiring pad PP21 formed as the metal wiring layer M2 and a resistance value per one piece of through-hole electrode 1341P which connects the wiring pad PP21 and a wiring pad PP31 formed as the metal wiring layer M3.

Figure 11:
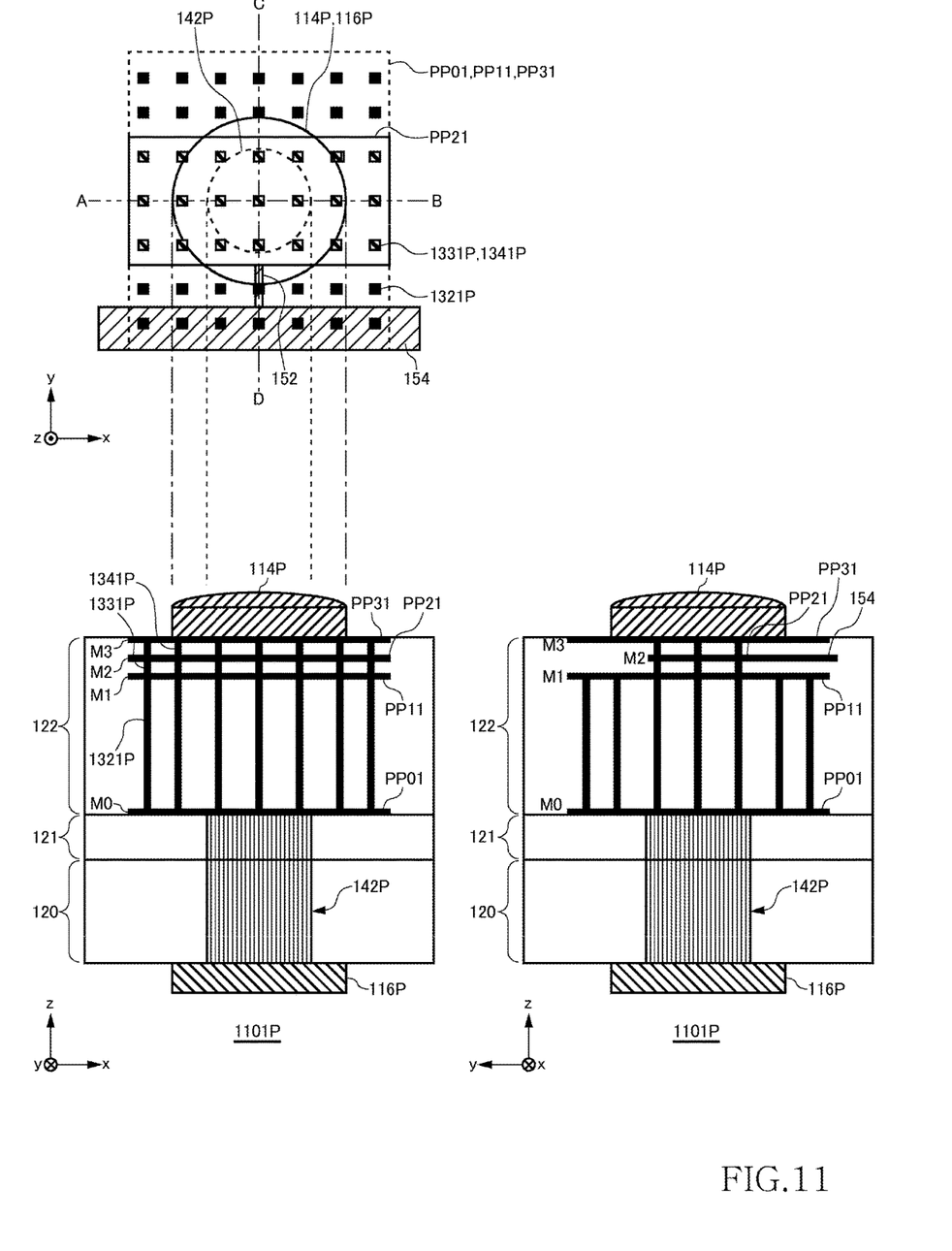
FIG. 11 is a modified example of the power penetration electrode shown in FIGS. 7 and 8.

In the power penetration electrode 1101P shown in FIG. 11, in view of the aforementioned difference of resistance values among the through-hole electrodes, the through-hole electrodes 1321P are arranged to exceed the number of the through-hole electrodes 1131P and the number of the through-hole electrodes 1341P in the structure. That is, the length of the wiring pad PP01 in y direction and the length of the wiring pad PP11 in y direction are made longer than the length of the wiring pads PP21 in y direction. More precisely, areas set for the wiring pads PP01 and the wiring pads PP11 are larger than an area set for the wiring pads PP21. Here, the wiring pads PP21 are formed into a rectangular shape with a long side along a direction to which the power wiring 154 arranged in the metal wiring layer M2 is elongated or along x direction, similar to the wiring pad PP2 in the power penetration electrode 110 as shown in FIGS. 7 and 8. Owing to such a structure, a relatively large number of the through-hole electrodes 1321P is arranged in a space between the wiring pad P01 and the wiring pad P11 exposed to a relatively large resistance value in order to reduce a resistance value in the power penetration electrode 1101P or suppress a voltage drop of a power voltage, while enabling to ensure a wiring area in the metal wiring layer M2 including the wiring pads PP21. Note that FIG. 11 shows the wiring pad PP31 has substantially the same area as the wiring pad PP01 and the wiring pad PP11 for the purpose of using the wiring pad PP31 as an etching stop layer in formation of the front side bump 114P. Accordingly, the wiring pad PP31 may have an area of any size which is suitable for working as an etching stop layer in formation of the front side bump 114P and may not have substantially the same area as the wiring pad PP01 and the wiring pad PP11.

Figure 12:
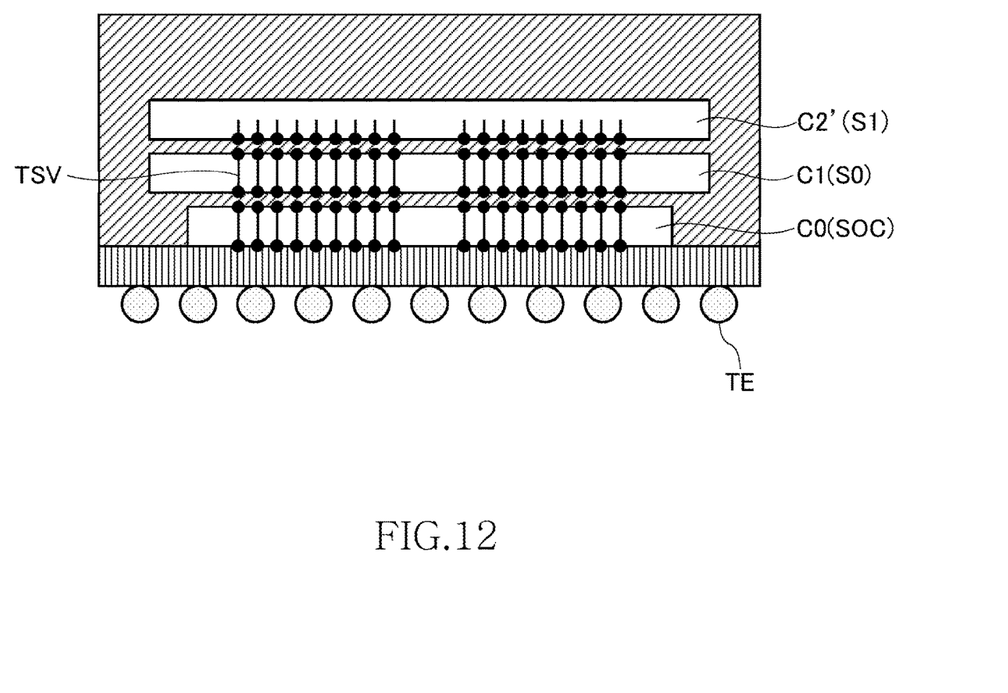
FIG. 12 is a cross-sectional view of a semiconductor device 200 of another embodiment of the present invention.

FIG. 12 illustrates another example of the semiconductor device 200. Same elements as FIG. 3 are indicated by the same numbers, and explanation for them is omitted. In this Example, a top chip C2' does not have body parts of penetration electrodes, which is different from the semiconductor chip C1. It is unnecessary to provide a body parts of penetration electrodes in the top chip C2' because the semiconductor chips C1 and C2' are stacked in a face-down manner. A step of forming body parts of penetration electrodes is merely omitted, channels, multi-level wiring structure that includes a wiring pad parts of penetration electrodes and the like may be formed as same as another semiconductor chip C1. It is preferable that the semiconductor chip C2' is greater in thickness than the semiconductor chip C1.

The present invention has been described so far in conjunction with an embodiment thereof. Such an embodiment has been given by way of illustration. It will be understood by those skilled in the art that various modifications and alterations may be made within the scope of claims of the present invention, and such modifications and alterations are also embraced within the scope of claims of the present invention. The description of the specification and the drawings are therefore to be considered exemplary, not restrictive.

The wiring pads PP in the power penetration electrode 110P do not need to have a rectangular shape. For example, they may be formed into an elliptical shape and a laterally extended rhombus shape. In any case, a shape with the largest width in a wiring direction may be employed. Note that the width of the wiring pads PS in the signal penetration electrode 110S is desirably equal to the width of the wiring pads PP in the power penetration electrode 110P in a direction orthogonal to a wiring direction but it is not a prerequisite for the present invention.

Also, the present invention is not limited to the aforementioned so-called Wide-IO DRAM suggested as an applicable semiconductor device and also applicable to a stacked semiconductor device in which an interface chip with an exclusively integrated so-called front end part (or front end function) of DRAM being a part for serving as an interface to the outside and a core chip with an exclusively integrated back end part (or back end function) of DRAM excluding the above front end part are stacked and connected to each other by penetration electrodes TSV. Furthermore, the present invention is not limited to DRAM and applicable to a semiconductor device provided with a plurality of signal penetration electrodes and a plurality of power penetration electrodes.

What is claimed is:
1. A device comprising:
a semiconductor substrate;
a plurality of penetration electrodes penetrating through the semiconductor substrate, each one of the plurality of penetration electrodes including a plurality of wiring pads, each of the wiring pads vertically aligned with and electrically connected to a front side bump and to an associated conductive body part; and
a horizontally elongated wiring elongated in a horizontal direction and electrically connected to one of the wiring pads,
wherein a shape in plan view of at least one of the wiring pads is configured to be elongated in a first direction substantially parallel to the horizontal direction of the horizontally elongated wiring, to have in plan view, a first width in the first direction and a second width in a second direction crossing to the first direction, the first width being larger than the second width.

2. The device as claimed in claim 1, wherein at least one of the plurality of wiring pads has a rectangular shape in plan view.

3. The device as claimed in claim 1, wherein the plurality of penetration electrodes are arranged in a matrix form in the first direction and the second direction.

4. The device as claimed in claim 1, wherein the plurality of the penetration electrodes includes a signal penetration electrode for signal transmission and a power penetration electrode for power supply, and wherein the wiring pad corresponding to the power penetration electrode has a shape with a larger area than the front side bump.

5. The device as claimed in claim 4, wherein the first width of the wiring pad corresponding to the power penetration electrode in the first direction is larger than a width of wiring pad corresponding to the signal penetration electrode in the first direction.

6. The device as claimed in claim 1, wherein the wiring and the wiring pads are formed in a wiring layer provided on a main surface of the semiconductor substrate.

7. The device as claimed in claim 1, wherein at least one of the plurality of the wiring pads has a square shape.

8. The device as claimed in claim 7, wherein the at least one of the wiring pads is larger in area than an associated front side bump.

9. The device as claimed in claim 1, wherein the plurality of vertically aligned wiring pads have respectively different spacing in a vertical direction.

10. The device as claimed in claim 1, wherein the plurality of vertically aligned wiring pads are electrically connected via one or more through hole electrodes.

11. The device as claimed in claim 10, wherein the one or more through hole electrodes have different resistance value.

12. The device as claimed in claim 1, wherein
the plurality of the penetration electrodes includes at least one signal penetration electrode for signal transmission and at least one power penetration electrode for power supply, and
the at least one signal penetration electrode has a first number of through-hole electrodes connecting the electrode pads and the at least one power penetration electrode has a second number of through-hole electrodes connecting the electrode pads, the second number being larger than the first number.

13. The device of claim 1, wherein the at least one wiring pad is adjacent to the horizontally elongated wiring.

14. The device of claim 1, further comprising a second horizontally elongated wiring elongated in a second horizontal direction, different from the horizontal direction of the horizontally elongated wiring and electrically connected to one or more of the wiring pads of one or more of the plurality of penetration electrodes,
wherein a shape, in plan view, of another one of the wiring pads is configured to be elongated in a direction substantially parallel to the second horizontal direction.

15. A device, comprising:
a semiconductor substrate;
a plurality of penetration electrodes penetrating through the semiconductor substrate in a vertical direction, each penetration electrode comprising:
a front side bump, and
a plurality of wiring pads aligned with the front side bump in the vertical direction and electrically coupled to the front side bump; and
a first elongated wiring elongated in a first wiring elongation direction in a horizontal plane and electrically coupled to one or more of the wiring pads of one or more of the penetration electrodes,
wherein one or more of the wiring pads of a first penetration electrode of the plurality of penetration electrodes are formed in a first shape, the first shape configured to elongate the one or more wiring pads of the first penetration electrode in a first pad elongation direction substantially parallel to the first wiring elongation direction in the horizontal plane,
wherein wiring pads of one or more other penetration electrodes of the plurality of penetration electrodes are formed in a different shape from the first shape.

16. The device of claim 15, wherein the first penetration electrode is adjacent to the first elongated wiring.

17. The device of claim 15, further comprising a second elongated wiring, wherein the second elongated wiring is elongated in a second wiring elongation direction in the horizontal plane, different from the first wiring elongation direction, and
wherein one or more of the wiring pads of a second penetration electrode of the plurality of penetration electrodes are formed in a second shape in the horizontal plane, different from the first shape, the second shape configured to elongate the one or more wiring pads of the second penetration electrode in a second pad elongation direction substantially parallel to the second wiring elongation direction.

18. The device of claim 17, wherein the second penetration electrode is adjacent to the second elongated wiring.

19. The device of claim 17, wherein the second pad elongation direction is substantially perpendicular to the first pad elongation direction in the horizontal plane.

20. The device of claim 17, wherein wiring pads of a third penetration electrode of the plurality of penetration electrodes are formed in a third shape that differs from both the first shape and the second shape.

21. A device, comprising:
a plurality of penetration electrodes configured to penetrate a semiconductor substrate in a vertical direction, each of the plurality of penetration electrodes comprising,
a plurality of wiring pads aligned with the penetration electrode in the vertical direction,
a front side bump in electrical communication with one or more of the plurality of wiring pads of the penetration electrode, and
a back side bump in electrical communication with one or more of the plurality of wiring pads of the penetration electrode;
a first wiring elongated in a first wiring elongation direction in a horizontal plane, wherein the first wiring is in electrical communication with one or more of the wiring pads of one or more of the plurality of penetration electrodes; and
a second wiring elongated in a second wiring elongation direction in the horizontal plane, different from the first wiring elongation direction, wherein the first wiring is in electrical communication with one or more of the wiring pads of one or more of the plurality of penetration electrodes,
wherein the wiring pads of a first penetration electrode of the plurality of penetration electrodes adjacent to the first wiring in the horizontal plane are formed in a first shape, the first shape configured to elongate the wiring pads of the first penetration electrode in a direction substantially parallel to the first wiring elongation direction,
wherein the wiring pads of a second penetration electrode of the plurality of penetration electrodes adjacent to the second wiring in the horizontal plane are formed in a second shape, different from the first shape, the second shape configured to elongate the wiring pads of the second penetration electrode in a direction substantially parallel to the second wiring elongation direction.

22. The device of claim 21, wherein the first shape of the wiring pads of the first penetration electrode, and the second shape of the wiring pads of the second penetration electrode differ from a third shape of the wiring pads of one or more other penetration electrodes of the plurality of penetration electrodes.

23. The device of claim 21, wherein the first wiring elongation direction is substantially perpendicular to the second wiring elongation direction.

* * * * *